(12) United States Patent
Korobov et al.

(10) Patent No.: US 10,103,190 B2
(45) Date of Patent: Oct. 16, 2018

(54) IMAGING SENSOR HAVING FLOATING REGION OF IMAGING DEVICE ON ONE SUBSTRATE ELECTRICALLY COUPLED TO ANOTHER FLOATING REGION FORMED ON A SECOND SUBSTRATE

(71) Applicant: SEMICONDUCTOR COMPONENTS INDUSTRIES, LLC, Phoenix, AZ (US)

(72) Inventors: Vladimir Korobov, San Mateo, CA (US); Robert Michael Guidash, Rochester, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/154,668

(22) Filed: May 13, 2016

(65) Prior Publication Data

US 2017/0330906 A1 Nov. 16, 2017

(51) Int. Cl.
*H01L 27/146* (2006.01)

(52) U.S. Cl.
CPC .... *H01L 27/1463* (2013.01); *H01L 27/14605* (2013.01); *H01L 27/14614* (2013.01); *H01L 27/14636* (2013.01); *H01L 27/14643* (2013.01); *H01L 27/14689* (2013.01); *H01L 27/14692* (2013.01)

(58) Field of Classification Search
CPC ............. H01L 27/1461; H01L 27/1463; H01L 27/14636; H01L 27/14638
See application file for complete search history.

(56) References Cited

U.S. PATENT DOCUMENTS

| 7,781,716 B2 * | 8/2010 | Anderson | G02B 3/0056 |
| | | | 250/208.1 |
| 9,094,624 B2 * | 7/2015 | Shimotsusa | H01L 27/14627 |
| 2006/0273240 A1 * | 12/2006 | Guidash | H04N 5/365 |
| | | | 250/208.1 |

(Continued)

OTHER PUBLICATIONS

Ma et al., "Jot Devices and the Quanta Image Sensor"; Proceeding of the IEEE International Electron Devices Meeting; Dec. 2014; pp. 10.1.1-10.1.4.

(Continued)

*Primary Examiner* — Anh D Mai
(74) *Attorney, Agent, or Firm* — Treyz Law Group, P.C.; Joseph F. Guihan

(57) ABSTRACT

An image sensor may include a symmetrical imaging pixel with a floating diffusion region. The floating diffusion region may be formed in the center of the imaging pixel. A shallow p-well may be formed around the floating diffusion region. A transfer gate configured to transfer charge from a photodiode to the floating diffusion region may be ring-shaped with an opening that overlaps the floating diffusion region. Isolation regions including deep trench isolation and a p-well may surround the photodiode of the imaging pixel. A p-stripe may couple the shallow p-well around the floating diffusion region to the isolation regions. The floating diffusion regions of neighboring pixels may be coupled together with additional conductive layers to implement shared configurations.

19 Claims, 16 Drawing Sheets

(56) References Cited

U.S. PATENT DOCUMENTS

| | | | | |
|---|---|---|---|---|
| 2009/0140304 A1* | 6/2009 | Kudoh | .............. | H01L 27/14603 |
| | | | | 257/292 |
| 2011/0220976 A1* | 9/2011 | Iida | .................... | H01L 27/1462 |
| | | | | 257/291 |
| 2016/0343751 A1* | 11/2016 | Sze | ..................... | H01L 27/1464 |
| 2017/0257578 A1* | 9/2017 | Velichko | ........... | H01L 27/14629 |

OTHER PUBLICATIONS

Mamdy et al., "A low-noise, P-type, vertically-pinned and backside-illuminated pixel structure for image sensor applications"; Proceeding of the IEEE International Image Sensor Workshop; Jun. 2015.

Hynecek, U.S. Appl. No. 62/252,767, filed Nov. 9, 2015.

Hong, U.S. Appl. No. 14/877,722, filed Oct. 7, 2015.

Velichko et al., U.S. Appl. No. 14/836,599, filed Aug. 26, 2015.

\* cited by examiner

IMAGING SENSOR HAVING FLOATING REGION OF IMAGING DEVICE ON ONE SUBSTRATE ELECTRICALLY COUPLED TO ANOTHER FLOATING REGION FORMED ON A SECOND SUBSTRATE

BACKGROUND

This relates generally to imaging systems and, more particularly, to imaging systems that have symmetrical pixels.

Modern electronic devices such as cellular telephones, cameras, and computers often use digital image sensors. Image sensors (sometimes referred to as imagers) may be formed from a two-dimensional array of image sensing pixels. Each pixel includes a photosensitive layer that receives incident photons (light) and converts the photons into electrical charge. Image sensors are sometimes designed to provide images to electronic devices using a Joint Photographic Experts Group (JPEG) format.

Conventional image sensors may include imaging pixels with floating diffusion regions. Charge generated in the photosensitive layers may be transferred to the floating diffusion regions for subsequent readout. In conventional imaging pixels, floating diffusion regions are typically formed in the corner of imaging pixels. However, this leads to asymmetries in the pixel, which can cause image artifacts and reduced versatility of the pixels. Additionally, in conventional image sensors it can be difficult to enclose photodiodes with deep trench isolation (DTI).

It would therefore be desirable to provide improved imaging pixels for image sensors.

DETAILED DESCRIPTION

Figure 1:
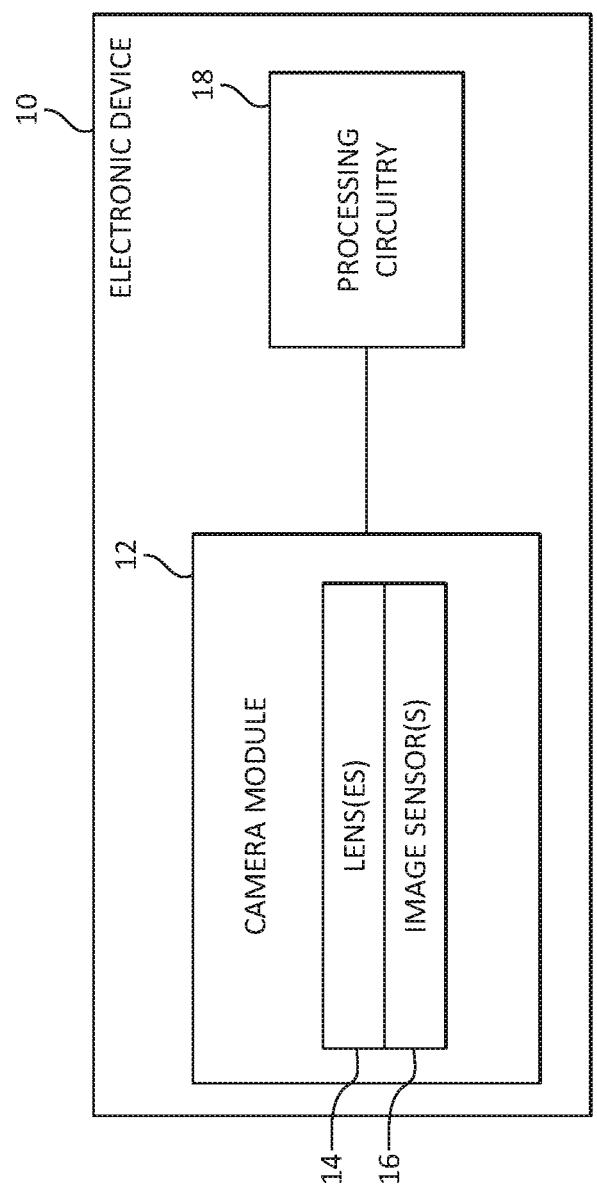
FIG. 1 is a schematic diagram of an illustrative electronic device that may include an image sensor in accordance with an embodiment of the present invention.

Embodiments of the present invention relate to image sensors with pixels that may be back side illuminated pixels. An illustrative electronic device that may include back side illuminated pixels is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
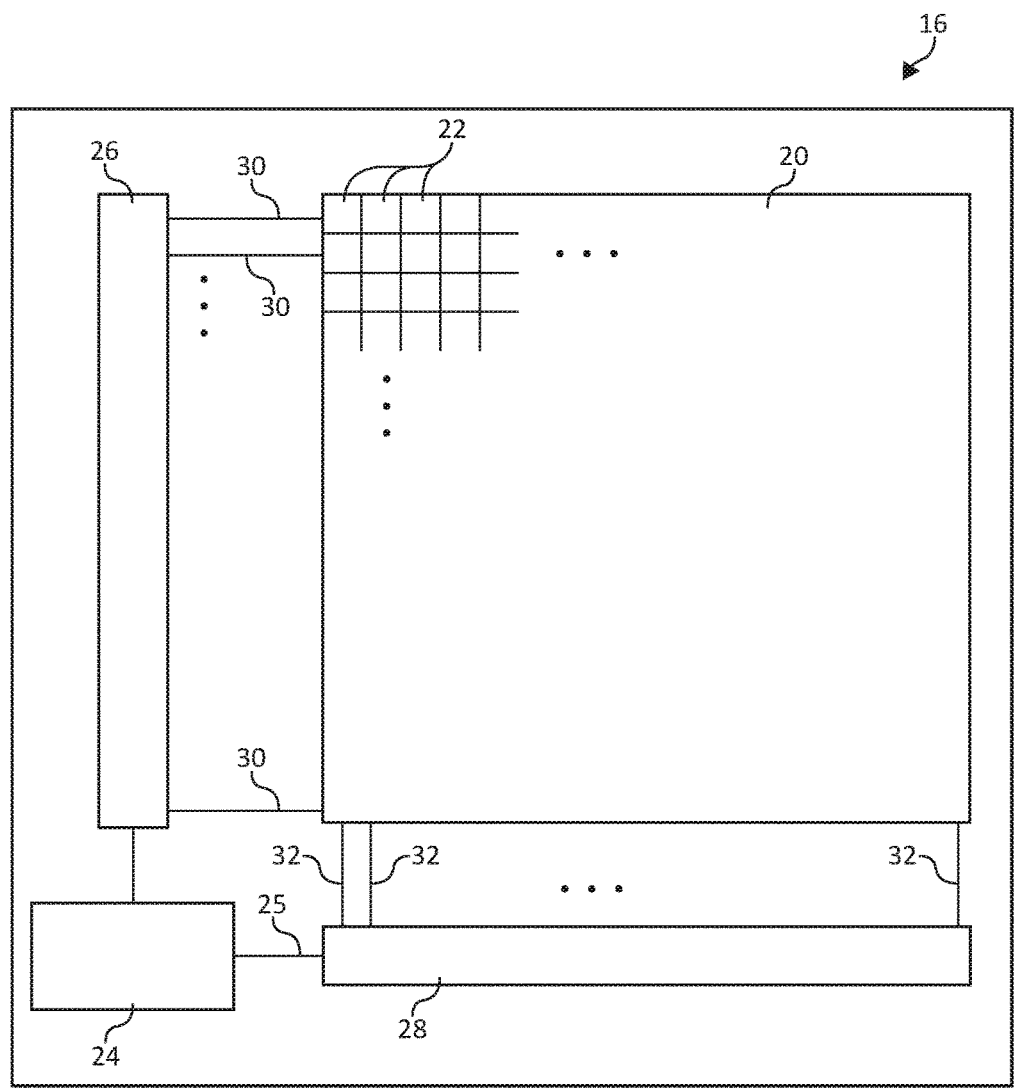
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry).

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
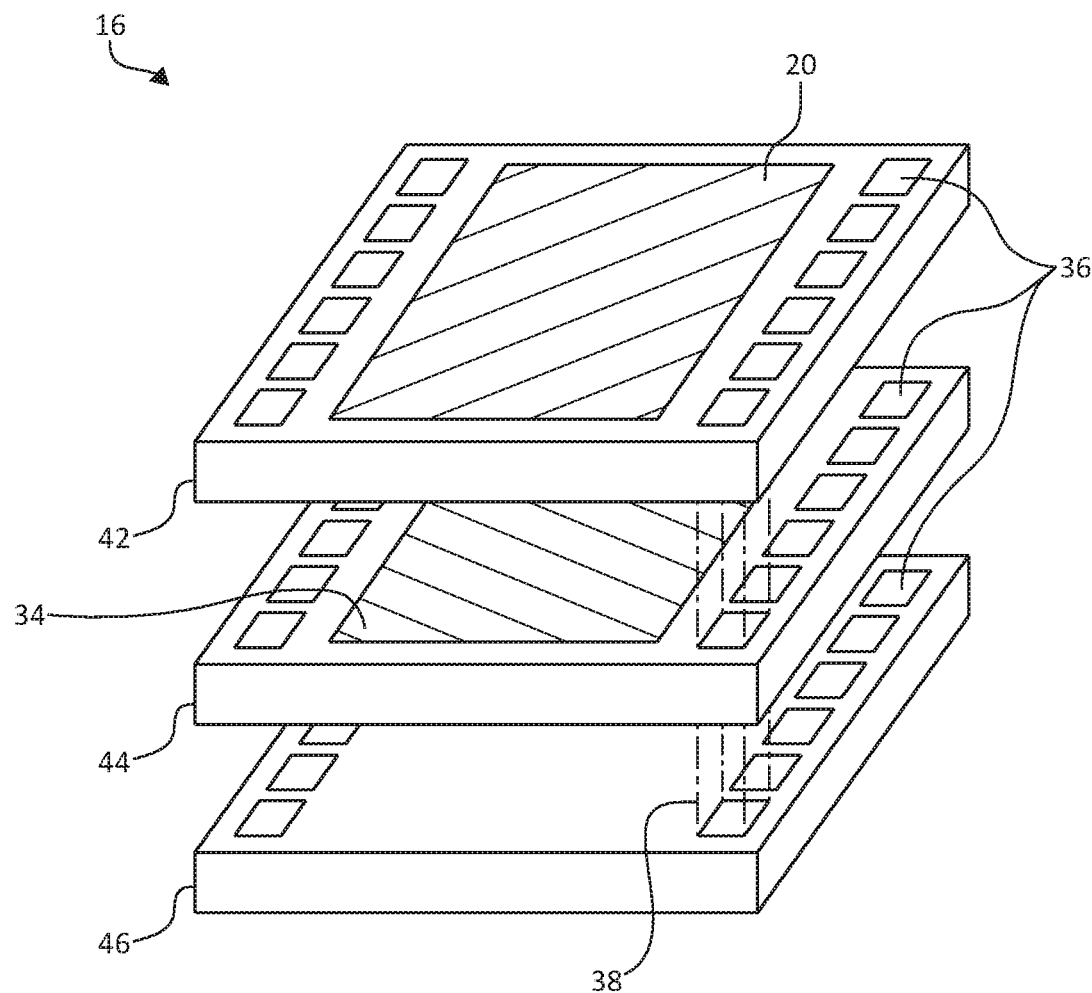
FIG. 3 is a perspective view of an image sensor with multiple substrates bonded together in accordance with an embodiment of the present invention.

FIG. 3 shows an illustrative image sensor such as image sensor 16 in FIG. 1. Image sensor 16 may be formed with one or more substrate layers. The substrate layers may be layers of semiconductor material such as silicon. The substrate layers may be connected using metal interconnects. An example is shown in FIG. 3 in which substrates 42, 44, and 46 are used to form image sensor 16. Substrates 42, 44 and 46 may sometimes be referred to as chips or wafers. Upper chip 42 may contain photodiodes in pixel array 20. Charge transferring transistor gates may also be included in upper chip 42. However, to ensure that there is adequate room for the photodiodes in upper chip 42, much of the pixel circuitry for the pixels may be formed in middle chip 44.

Middle chip 44 may be bonded to upper chip 42 with an interconnect layer at every pixel. For example, pixel circuitry 34 in middle chip 44 may be bonded to a Floating Diffusion (FD) that is connected to a charge transfer transistor formed in upper chip 42. Bonding each pixel in upper chip 42 to corresponding pixel circuitry in middle chip 44 (e.g., floating diffusion to floating diffusion) may be referred to as hybrid bonding. Middle chip 44 and lower chip 46 may not be coupled with hybrid bonding. Only peripheral electrical contact pads 36 of each chip may be bonded together (e.g., chip-to-chip connections 38). Each chip in image sensor 16 may include relevant circuitry. The upper chip may contain photodiodes, floating diffusion nodes, and charge transferring transistor gates. The middle chip may include pixel circuitry (e.g., floating diffusion node, source follower transistor, reset transistor etc.). The bottom chip may include one or more of clock generating circuits, pixel addressing circuits, signal processing circuits such as the CDS circuits, analog to digital converter circuits, digital image processing circuits, and system interface circuits. The example of FIG. 3 where image sensor 16 has three substrates is merely illustrative. If desired, image sensor 16 may be formed from one, two, three, or more than three substrates.

Figure 4:
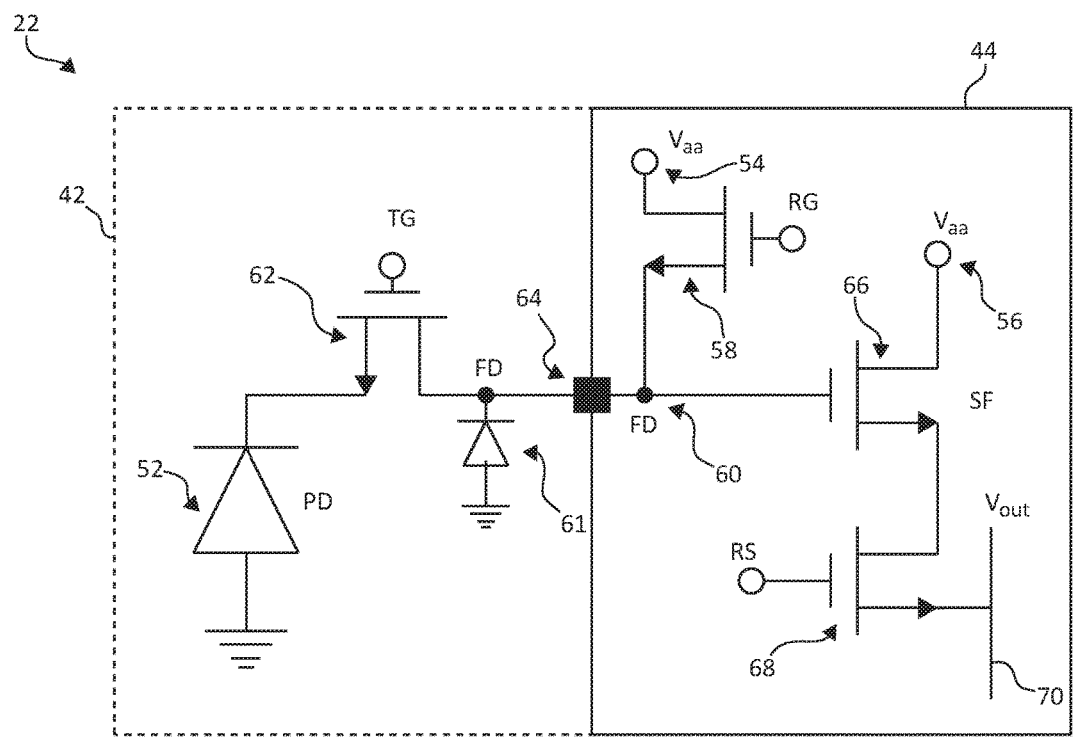
FIG. 4 is a circuit diagram of an illustrative imaging pixel with multiple substrates in accordance with an embodiment of the present invention.

FIG. 4 is a circuit diagram of an illustrative image pixel 22. As shown in FIG. 4, pixel 22 includes a photosensitive element such as photodiode 52. A positive power supply voltage Vaa may be supplied at positive power supply terminal 54. A second power supply voltage Vaa may be supplied at second power supply terminal 56. Incoming light may be collected by photodiode 52 after passing through a color filter structure. Photodiode 52 generates charge (e.g., electrons) in response to receiving impinging photons. The amount of charge that is collected by photodiode 52 depends on the intensity of the impinging light and the exposure duration (or integration time).

Before an image is acquired, reset control signal RG may be asserted. Asserting signal RG turns on reset transistor 58 and resets charge storage node 60 (sometimes referred to as floating diffusion region FD) to a voltage close to Vaa. Reset control signal RG may then be deasserted to turn off reset transistor 58.

Pixel 22 may include a transfer gate (transistor) 62. Transfer gate 62 may have a gate terminal that is controlled by transfer control signal TG. Transfer signal TG may be pulsed to transfer charge from photodiode 52 to charge storage region 61. Charge storage region 61 may be a floating diffusion region. Floating diffusion region 61 may be a doped semiconductor region (e.g., a region in a silicon substrate that is doped by ion implantation, impurity diffusion, or other doping process). Floating diffusion region 61 may be formed in an upper wafer (e.g., upper wafer 42 in FIG. 3) while floating diffusion region 60 may be formed in an additional wafer (e.g., middle wafer 44 in FIG. 3).

Floating diffusion regions 60 and 61 may be connected by interconnect layer 64. Interconnect layer 64 may be formed from a conductive material such as metal. In certain embodiments, the interconnect layer may include solder. The interconnect layer may also be a through silicon via (TSV). In certain cases, floating diffusion regions 60 and 61 may collectively be referred to as a charge storage region.

If desired, pixel 22 may have additional storage regions for temporarily storing charge transferred from photodiode 52. For example, an intermediate memory node such as a diffused diode and intermediate transfer gate or any other suitable in-pixel memory configuration may be located between transfer transistor 62 and source follower transistor 66. The configuration of FIG. 4 is merely illustrative.

Pixel 22 may include readout circuitry. The charge readout circuit may include row-select transistor 68 and source-follower transistor 66 (SF). Transistor 68 may have a gate that is controlled by row select signal RS. When signal RS is asserted, transistor 68 is turned on and a corresponding signal Vout (e.g. an output signal having a magnitude that is proportional to the amount of charge at floating diffusion node 60), is passed onto output path 70.

In a typical image pixel array configuration, there are numerous rows and columns of pixels 22. A column readout path such as output line 70 may be associated with each column of pixels 22 (e.g. each image pixel 22 in a column may be coupled to output line 70 through an associated row-select transistor 68). Signal RS may be asserted to read out signal Vout from a selected image pixel onto column readout path 70. Image data Vout may be fed to processing circuitry 18 for further processing. The circuitry of FIG. 4 is merely illustrative. If desired, pixel 22 may include other pixel circuitry.

In the illustrative example of FIG. 4, wafer 42 includes photodiode 52, transfer gate 62, and floating diffusion region 61. Wafer 44 includes reset transistor 58, floating diffusion region 60, source follower transistor 66, and row select transistor 68. This example is merely illustrative. If desired, the entire pixel circuit may be formed in a single wafer. In another embodiment, additional circuitry (e.g., reset transistor 58) may be formed in wafer 42. In general, the pixel circuit may be split between any number of wafers in any desired combination.

Figure 5:
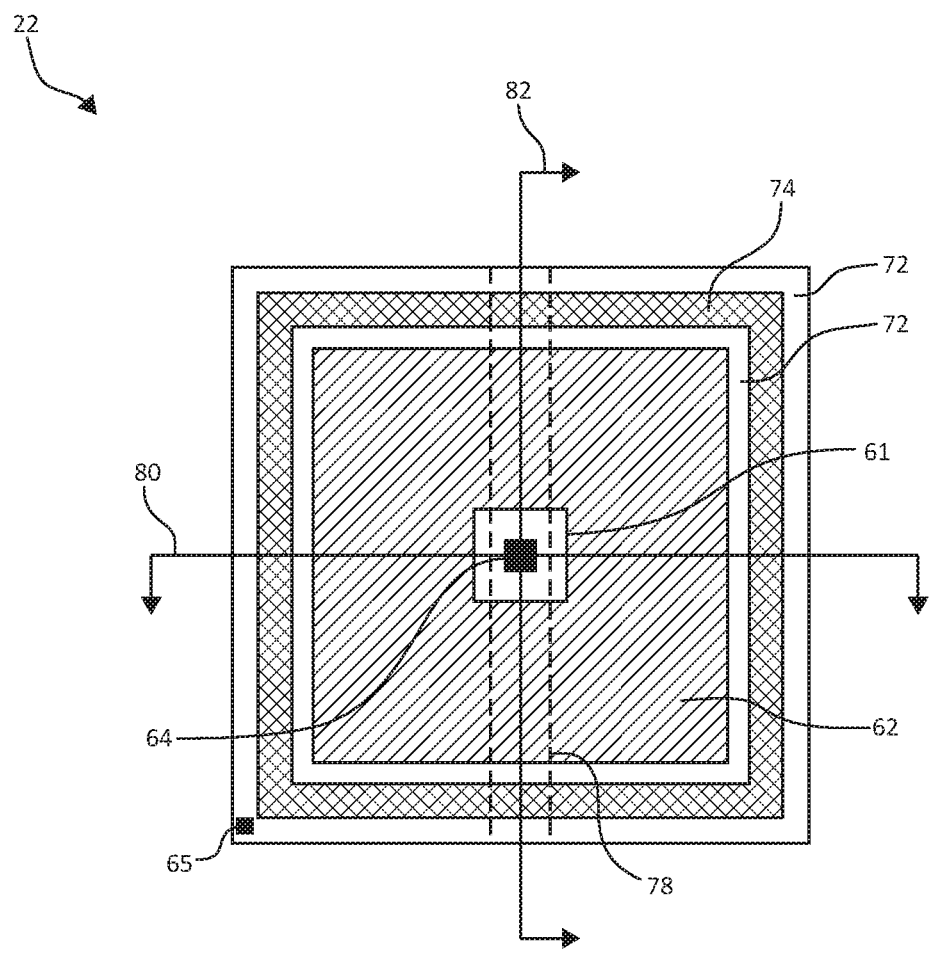
FIG. 5 is a top view of an illustrative symmetrical imaging pixel with a centrally located floating diffusion region in accordance with an embodiment of the present invention.

FIG. 5 is a top view of an illustrative symmetrical imaging pixel with a centrally located floating diffusion region. As shown, pixel 22 may include isolation regions that surround the pixel. The isolation regions may be formed from deep trench isolation 74 and p-well 72. Deep trench isolation structures 74 may be a p-type doped oxide (e.g., boron doped glass). In some embodiments, deep trench isolation structures 74 may instead be a p-type doped polysilicon (e.g., boron doped polysilicon). In other embodiments, deep trench isolation structures 74 may be a p-type doped polysilicon (e.g., boron doped polysilicon) having a liner (e.g., a phosphorous doped oxide liner). In yet other embodiments, deep trench isolation structures 74 may be a refractory metal (e.g., tungsten, molybdenum or other metals having a resistance to high heat, corrosion and wear) having a p-type oxide liner (e.g., boron doped oxide). P-well 72 may be formed from p-type doped silicon.

Pixel 22 may also include transfer gate 62. Transfer gate 62 may be configured to transfer charge from a photodiode to floating diffusion region 61. Floating diffusion region 61 may be coupled to interconnect layer 64. As shown in FIG. 5, floating diffusion region 61 may be formed in the center of pixel 22. This ensures that pixel 22 is symmetrical. Pixel 22 may also include a p-stripe 78 that runs through the pixel. P-stripe 78 may be a p-type doped region that is connected to the p-type isolation regions (e.g., p-well 72), which are grounded using ground contact 65.

Figure 6:
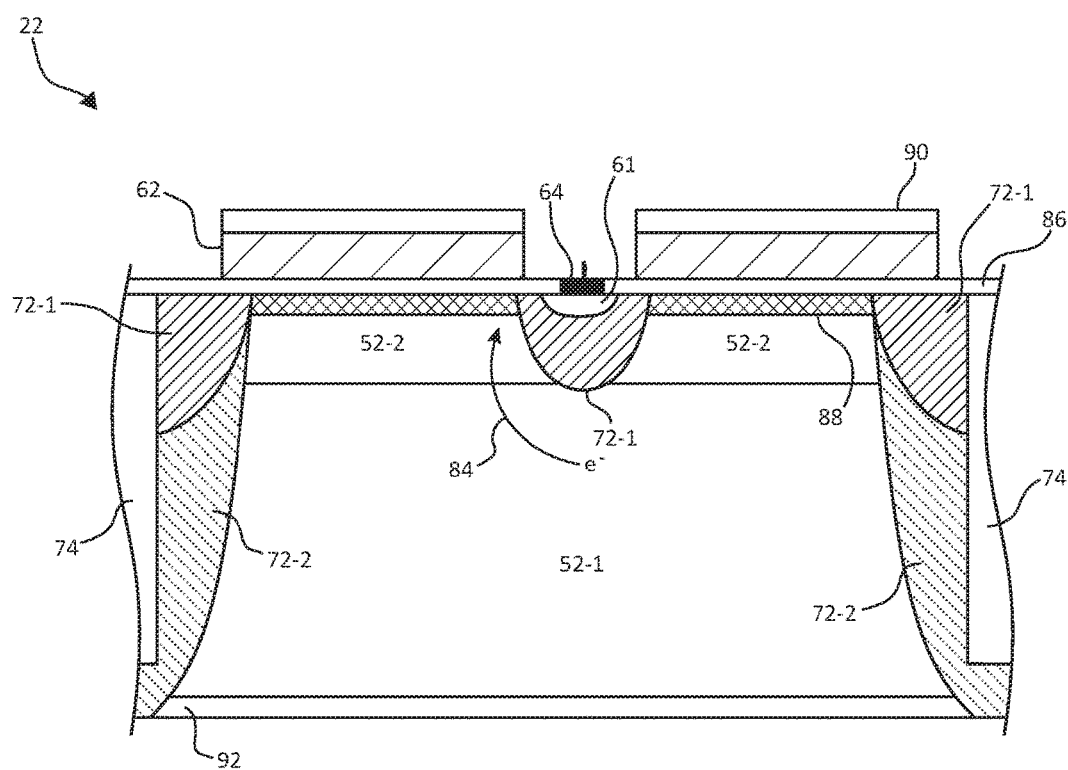
FIG. 6 is a cross-sectional side view of an illustrative imaging pixel taken along line 80 of FIG. 5 in accordance with an embodiment of the present invention.

FIG. 6 is a cross-sectional side view of pixel 22 taken along line 80 of FIG. 5. As shown in FIG. 6, floating diffusion region 61, transfer gate 62, and photodiode 52 may be formed in upper wafer 42. Isolation regions formed from deep trench isolation 74 and p-well 72 may surround photodiode 52. P-well 72 may be formed from shallow p-well 72-1 and deep p-well 72-2. Photodiode 52 may be formed form a shallow n-type photodiode region 52-2 and a deep n-type photodiode region 52-1. The photodiode may be a vertically pinned photodiode. During operation of the pixel, the doping profile of photodiode 52 may result in charge generated in the photodiode moving vertically towards the front side of the pixel (e.g., the charge may follow path 84). Then, when the transfer transistor is asserted, the charge may be transferred laterally to floating diffusion region 61.

Pixel 22 may include gate oxide 86 that separates transfer gate 62 from threshold adjustment layer 88. Threshold adjustment layer 88 may be a p-type doped layer. When transfer signal TG is pulsed to assert transfer transistor 62, at least part of threshold adjustment layer 88 may create a channel enabling charge to be transferred from photodiode 52 to floating diffusion region 61. Pixel 22 may also include a reflective layer. Reflective layer 90 may be formed from any desired material and may improve quantum efficiency in pixel 22. A region accumulated with holes 92 may be formed over photodiode 52.

If desired, photodiode 52 may be formed with a doping gradient from the back of the pixel to the front of the pixel. The back of the pixel may be the side of the pixel with the region accumulated with holes 92, while the front of the pixel may be the side of the pixel with transfer gate 62. The pixel may be illuminated by light that passes through the back side of the pixel. Pixel 22 may therefore be referred to as a back side illuminated pixel. Photodiode 52 may also have a doping gradient from the center of the pixel to the edges of the pixel. The doping gradients of photodiode 52 may act to ensure charge is fully transferred from photodiode 52 to floating diffusion 61 during charge transfer.

The use of deep trench isolation regions 74 in FIG. 6 is merely illustrative. If desired, pixel 22 may have isolation regions formed entirely from p-well 72. However, the deep trench isolation may enable a narrower p-well region and can therefore be used to decrease pixel size.

Figure 7:
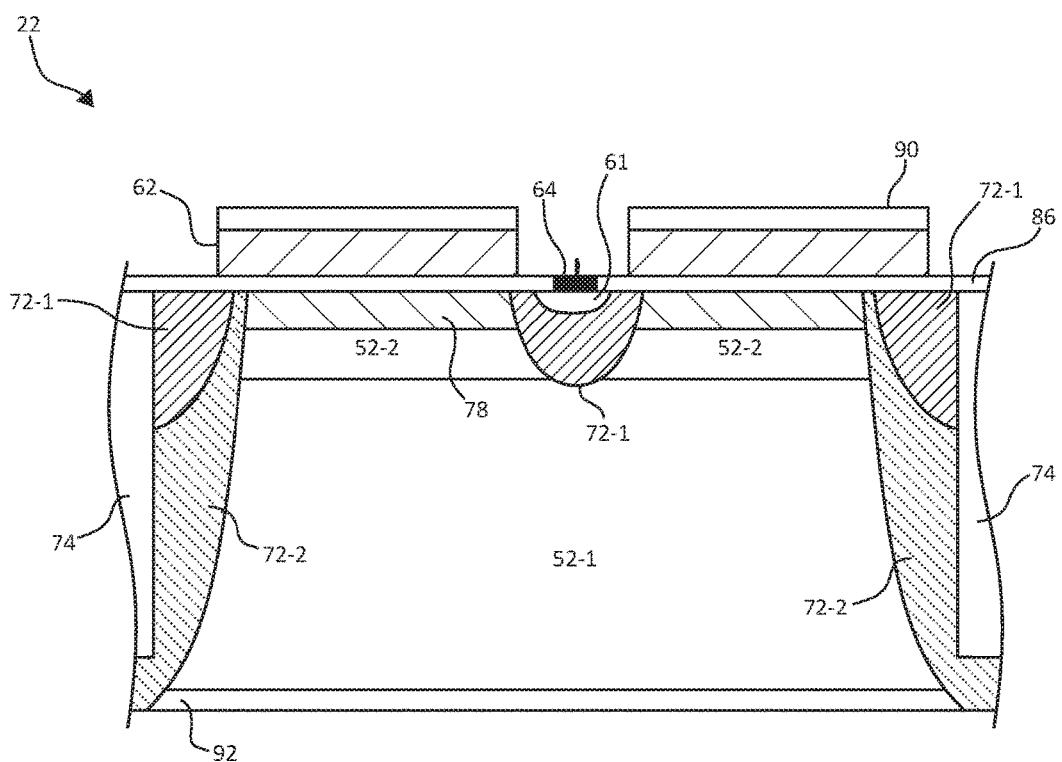
FIG. 7 is a cross-sectional side view of an illustrative imaging pixel taken along line 82 of FIG. 5 in accordance with an embodiment of the present invention.

FIG. 7 is a cross-sectional side view of pixel 22 taken along line 82 of FIG. 5. The cross-section of pixel 22 along line 82 is similar to the cross-section of pixel 22 taken along line 80 shown in FIG. 6. However, FIG. 7 shows p-stripe 78. P-stripe 78 may be a thin strip of p-type doped silicon that connects the central p-well 72-1 that surrounds floating diffusion 61 to ground. As discussed in connection with FIG. 5, p-stripe 78 may be connected to the p-type isolation regions. Accordingly, p-stripe 78 may couple the central shallow p-well to the p-type isolation regions which are grounded with ground contact 65. This effectively grounds the shallow p-well formed in the center of the pixel.

As shown in FIGS. 6 and 7, transfer gate 62 may have an opening that serves to define floating diffusion region 61. Transfer gate 62 may sometimes be described as having a donut shape or a ring shape. The example in FIG. 5 where transfer gate 62 is a square with a square shaped central opening is merely illustrative. Transfer gate 62 may have any desired shape (e.g., rectangular, circular, etc.) and may have an opening with any desired shape (e.g., rectangular, circular, etc.).

Although not explicitly shown in FIGS. 6 and 7, pixel 22 may also include a microlens formed over the photodiode. The microlens may be formed on the back side of the imaging pixel. If desired, a color filter structure and/or planarization layer may be included between the microlens and the photodiode. The microlens may be circularly shaped or elliptically shaped if desired. Alternatively, a toroidal microlens may be used to focus light on the portions of the photodiode that are not overlapping the floating diffusion region. In yet another embodiment, multiple microlenses may be used to focus light on the single photodiode in pixel 22.

Figure 8:
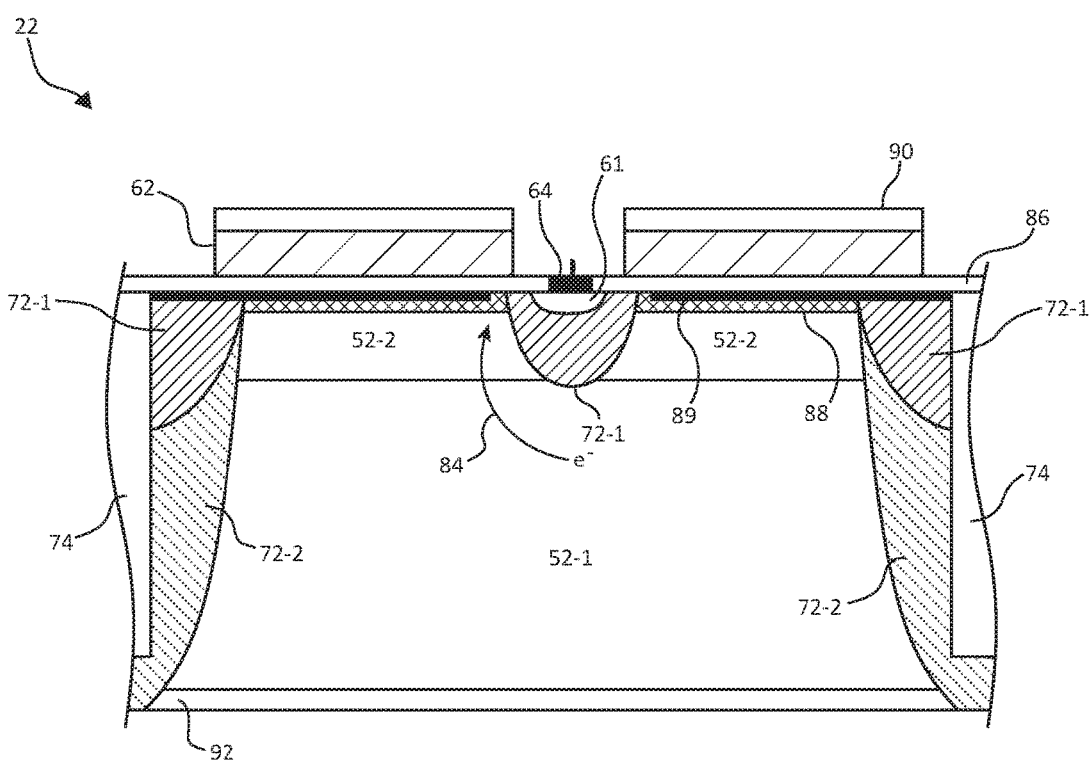
FIG. 8 is a cross-sectional side view of an illustrative imaging pixel with a pinning layer in accordance with an embodiment of the present invention.

In an alternate embodiment, imaging pixel 22 may include a pinning layer to aid with suppressing dark current in the imaging pixel. FIG. 8 is a cross-sectional side view of an illustrative imaging pixel with a pinning layer. As shown in FIG. 8, pinning layer 89 may extend across the pixel from deep trench isolation 74 towards floating diffusion region 61. Pinning layer 89 may be a p-type doped layer and may be more heavily doped than threshold adjustment layer 88.

Figure 9:
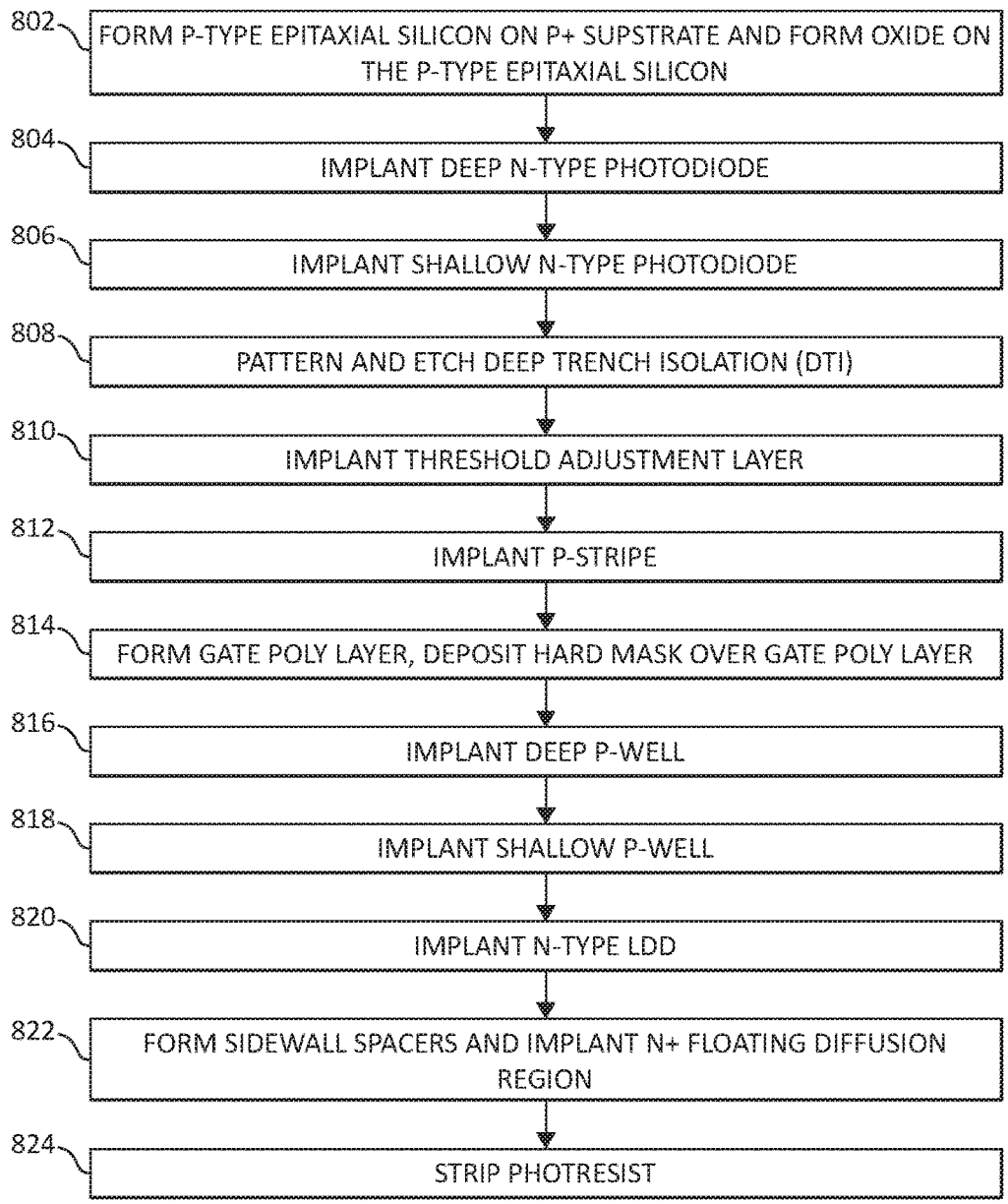
FIG. 9 shows illustrative method steps for forming an imaging pixel of the type shown in FIGS. 5-7 in accordance with an embodiment of the present invention.
Figure 10A:
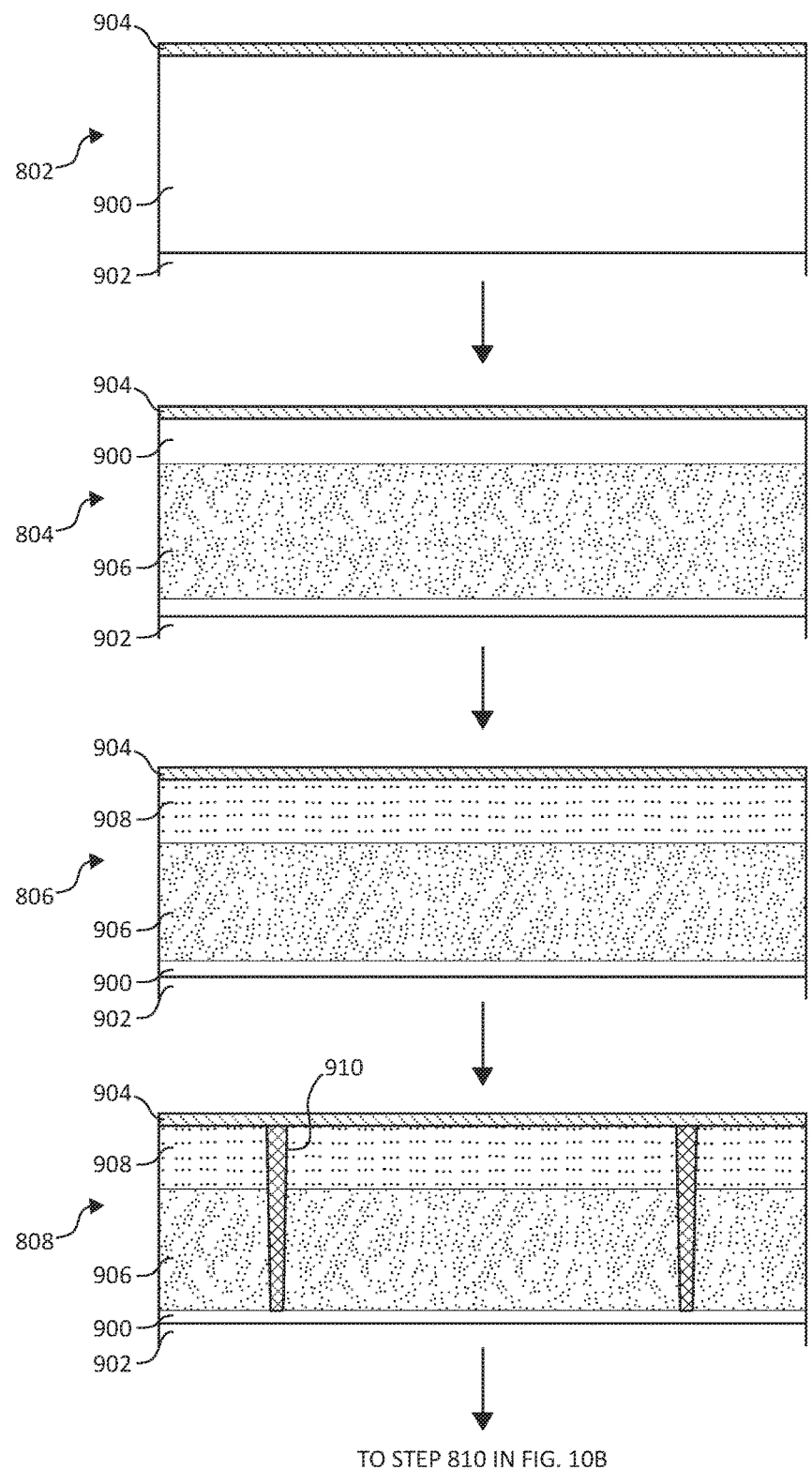
FIGS. 10A, 10B, and 10C show cross-sectional side views of an imaging pixel during the method steps of FIG. 9 in accordance with an embodiment of the present invention.

FIG. 9 shows illustrative method steps for forming an imaging pixel of the type shown in FIGS. 5-7. As shown, at step 802 a p-type epitaxial silicon layer may be formed on a substrate. The substrate may be a p+ substrate. Also at step 802, an oxide layer may be formed on the p-type epitaxial silicon layer. These features are also shown at step 802 in FIG. 10A, which shows a cross-sectional side view of pixel 22 during formation. As shown in FIG. 10A, p-type epitaxial silicon layer 900 may be formed on p+substrate layer 902. Additionally, oxide layer 904 may be formed on p-type epitaxial silicon layer 900.

At step 804, a deep n-type photodiode may be implanted into the p-type epitaxial silicon. As shown in FIG. 10A, deep n-type photodiode region 906 is formed in silicon layer 900. Next, at step 806, a shallow n-type photodiode may be implanted. As shown in FIG. 10A, shallow n-type photodiode region 908 may be formed such that shallow n-type photodiode region 908 and deep n-type photodiode region 906 form a continuous photodiode region. A thin layer of p-type epitaxial silicon 900 may remain adjacent to deep n-type photodiode 906. If desired, the shallow n-type photodiode and deep n-type photodiode may be formed using a blanket implant (e.g., an implant across the entire pixel array without using masking layer).

Next, deep trench isolation (DTI) may be formed at step 808. Deep trench isolation 910 (shown in FIG. 10A) may be formed via etching. For example, a masking layer may be formed over the pixel array in the areas that are not intended for deep trench isolation. The deep isolation regions may then be exposed to an etchant to form trenches. The trenches may subsequently be filled with an isolation material. If desired, oxide layer 904 may be stripped before the formation of deep trench isolation regions 910. In these embodiments, an additional oxide layer may be formed over the wafer after the deep trench isolation regions are formed. The additional oxide layer may be formed immediately after the deep trench isolation regions are formed or after another step in the method (e.g., after step 810, after step 812, after step 814, etc.).

Figure 10B:
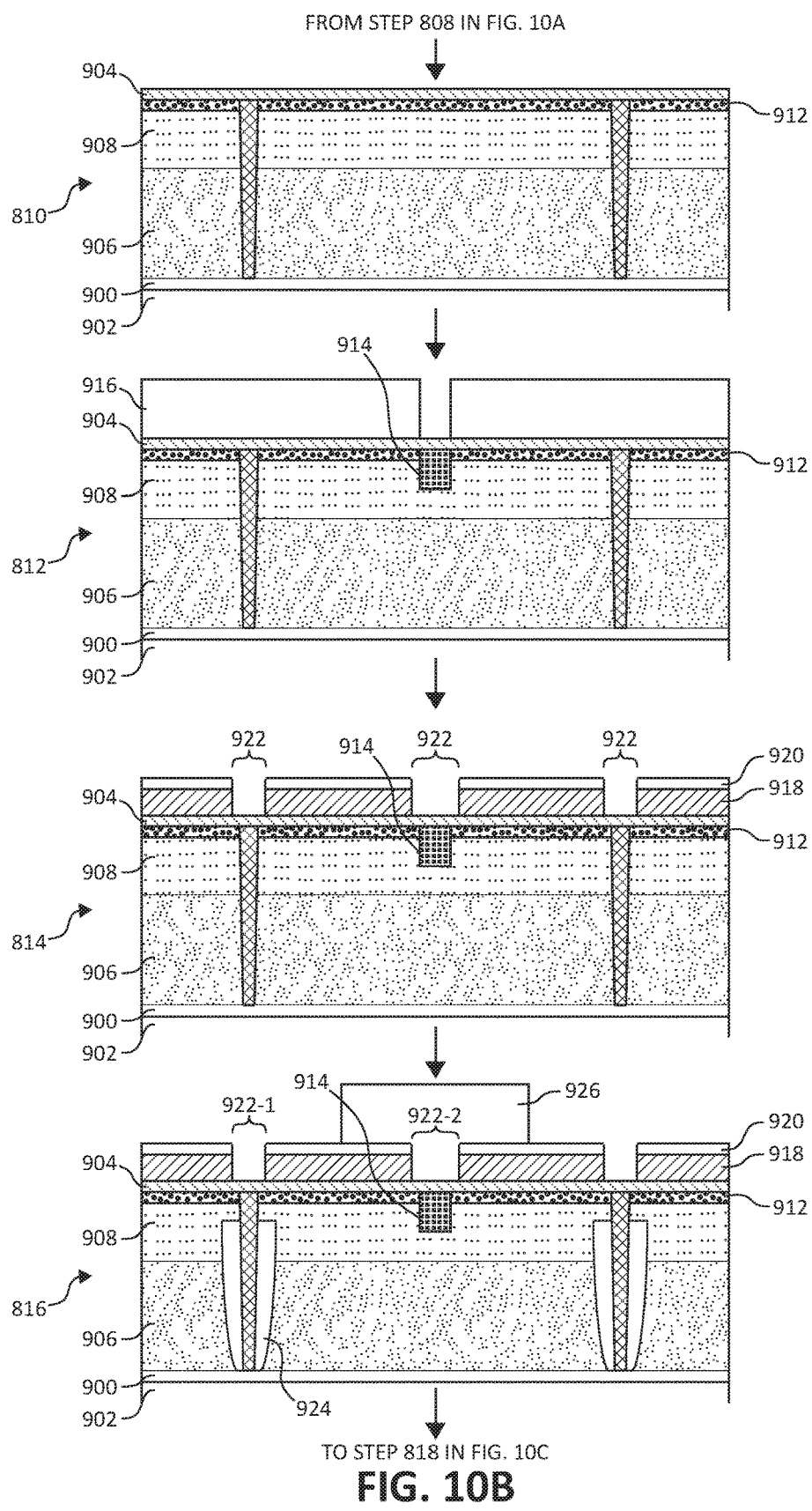

At step 810, a threshold adjustment layer may be implanted into the wafer. The threshold adjustment layer may be a p-type doped layer. In FIG. 10B, threshold adjustment layer 912 is shown at step 810. Next, p-stripe 914 may be implanted at step 812. P-stripe 914 may be formed using photoresist 916. Photoresist 916 may act as a masking layer that ensures that the p-type implant that forms p-stripe 914 is only implanted in the central portion of the pixel. P-stripe 914 may form an elongated stripe of p-type doped silicon that extends across the pixel (as shown in FIG. 5, for example). After p-stripe 914 has been implanted into the pixel, photoresist 916 may be removed.

At step 814, a gate polysilicon layer such as gate polysilicon 918 in FIG. 10B may be formed. Gate polysilicon layer 918 may form the gate for a transfer transistor (e.g., transfer transistor 62 in FIGS. 4-7). Also at step 814, a hard mask may be formed over polysilicon layer 918. If desired, hard mask 920 may be formed to assist in the patterning process that forms openings 922 in polysilicon layer 918. Oxide layer 904 (which may have been formed at a previous step or during step 814) may act as a gate oxide layer. Next, a deep p-well region such as deep p-well 924 in FIG. 10B may be formed at step 816. Deep p-well 924 may be formed from a p-type implant. Photoresist 926 may be formed as a mask to ensure that the deep p-well is only implanted in peripheral openings in gate polysilicon layer 918 (e.g., openings 922-1). Photoresist 926 may cover an opening 922-2 in the central portion of polysilicon layer 918.

Figure 10C:
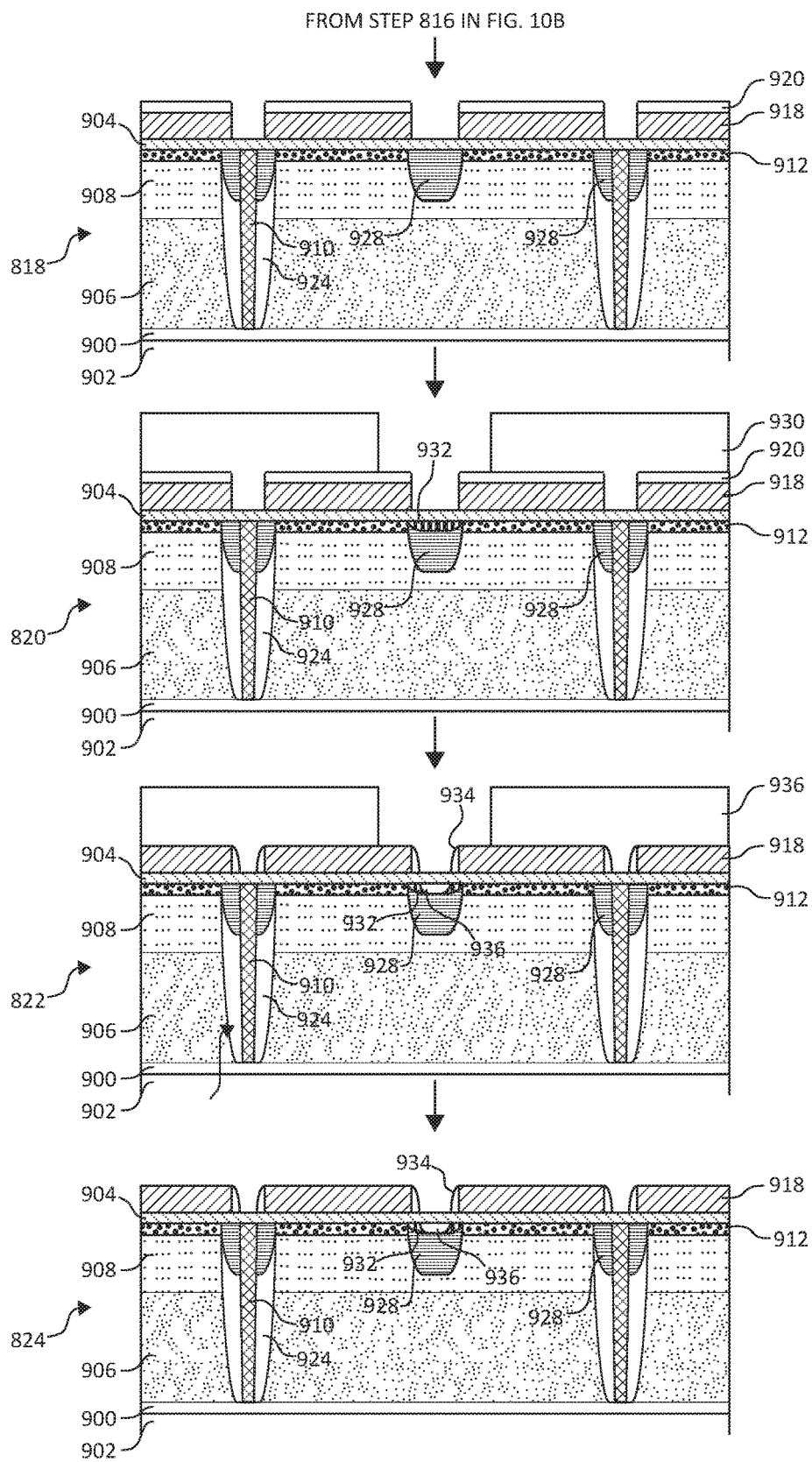

At step 818, shallow p-well regions may be formed. FIG. 10C shows shallow p-well regions 928 formed at step 818. Shallow p-well regions 928 may be formed such that shallow p-well regions 928 and deep p-well regions 924 form a continuous p-well region that surrounds deep trench isolation 910. Additionally, a shallow p-well region 928 may be formed in the central portion of the pixel around a portion of the p-stripe. Shallow p-well regions 928 may be formed using a blanket implant (i.e., without formation of an additional masking layer).

At step 820, an n-type lightly doped drain (LDD) region may be formed in the wafer. As shown in FIG. 10C, photoresist 930 may be deposited and patterned to cover the peripheral openings in the gate polysilicon layer. N-type lightly doped drain region 932 may then be implanted in the central opening in the gate polysilicon layer. Next, at step 822, photoresist 930 may be stripped. Hard mask layer 920 may also be stripped at this step. Additionally, a dielectric material 934 may be formed in the openings of gate polysilicon layer 918. The dielectric material may be etched to form sidewall spacers 934. After formation of the sidewall spacers, an additional photoresist layer 936 may be formed over the peripheral openings in the gate polysilicon layer. Subsequently, an n+ source/drain region 936 may be implanted in n-type lightly doped drain region 932. The n-type doped region 936 may act as the floating diffusion region for the pixel. Finally, at step 824, photoresist 936 may be stripped, as shown in FIG. 10C. This results in the final structure for the pixel.

If desired, a p+ source/drain region may be implanted in the corner of the pixel to form a ground contact (e.g., ground contact 65 in FIG. 5). To form this ground contact, an additional photoresist layer may be formed over the entirety of the pixel except for the portion where the ground contact will be located. The region may then be implanted with a p-type implant to form the ground contact. Additionally, substrate 902 may be thinned before, during, or after step 824. In certain embodiments, substrate 902 may be completely removed during the thinning process.

Figure 11:
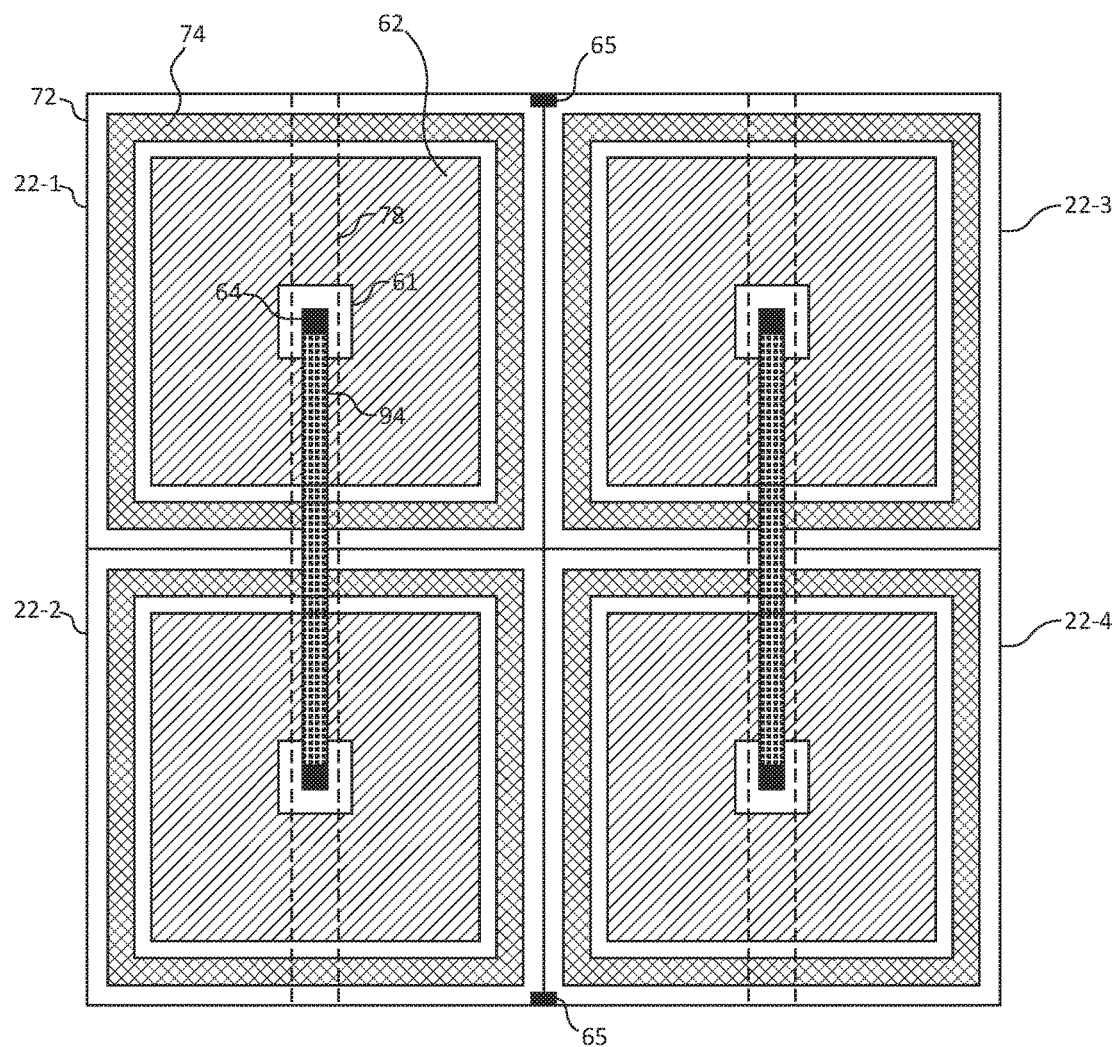
FIG. 11 is a top view of four illustrative imaging pixels that are arranged adjacent to each other in a 2×2 grid and that have a 2×1 shared configuration in accordance with an embodiment of the present invention.

One advantage of the pixels shown in FIGS. 4-10 is that the pixels are easy to use with various shared pixel architectures. In certain applications, it may be desirable for neighboring pixels to share certain components (e.g., a floating diffusion region, a reset transistor, etc.). Because the pixels described herein are symmetrical, the pixels may be used in a variety of different shared architectures without having to change the structure of the pixel. For example, the pixels shown in FIGS. 5-7 may be arranged in a 2×1 shared configuration, as shown in FIG. 11. FIG. 11 shows four imaging pixels (22-1, 22-2, 22-3, and 22-4) that are arranged adjacent to each other in a 2×2 grid. Each pixel may include deep trench isolation 74, p-well 72, transfer gate 62, floating diffusion region 61, and interconnect layer 64. The floating diffusion regions of adjacent pixels 22-1 and 22-2 may be coupled together with conductive layer 94 that connects respective contacts 64 in each pixel together. Pixels 22-3 and 22-4 may similarly be coupled together to share a floating diffusion region. The pixels may also share ground contacts if desired. As shown in FIG. 11, ground contacts 65 may be positioned between multiple pixels so that multiple pixels share the ground contact.

Figure 12:
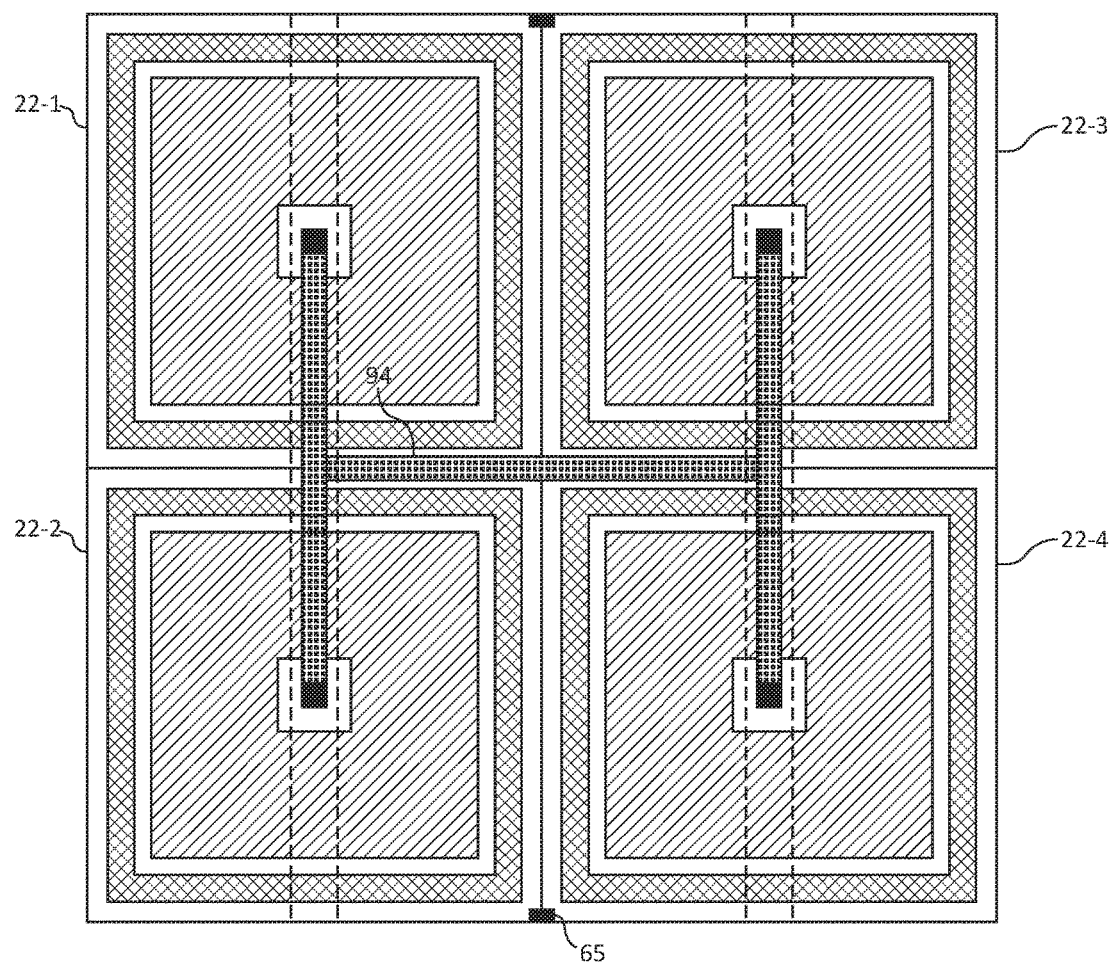
FIG. 12 is a top view of four illustrative imaging pixels that are arranged adjacent to each other in a 2×2 grid and that have a 2×2 shared configuration in accordance with an embodiment of the present invention.

FIG. 12 is a top view of illustrative image pixels with a 2×2 shared configuration. Because the structure of each pixel 22 is symmetrical, the structure of the pixels in FIG. 12 can remain the same as the structure of the pixels in FIG. 11 but have different sharing characteristics. As shown in FIG. 12, a conductive layer 94 can be connected to the contacts on the floating diffusion regions of pixels 22-1, 22-2, 22-3, and 22-4. Pixels 22-1, 22-2, 22-3, and 22-4 will therefore effectively share a floating diffusion region.

As shown in FIGS. 11 and 12, the symmetrical structure of pixels 22 enables pixels 22 to be very versatile. Arrays of pixels can be designed and manufactured so that the pixels have the structure shown in FIGS. 5-7. This allows the pixels to be designed with the same structure regardless of the sharing architecture, thus saving design time and costs, as well as to be manufactured in the same way, greatly saving on manufacturing costs. Optional additional conductive layers 94 may then be added to the array to form any level of shared architecture that is desired for the specific application of the image sensor. In contrast, in conventional pixel arrays the doping and design and layout of the pixels themselves must be designed specifically for the eventual shared configuration of the image sensor.

Figure 13:
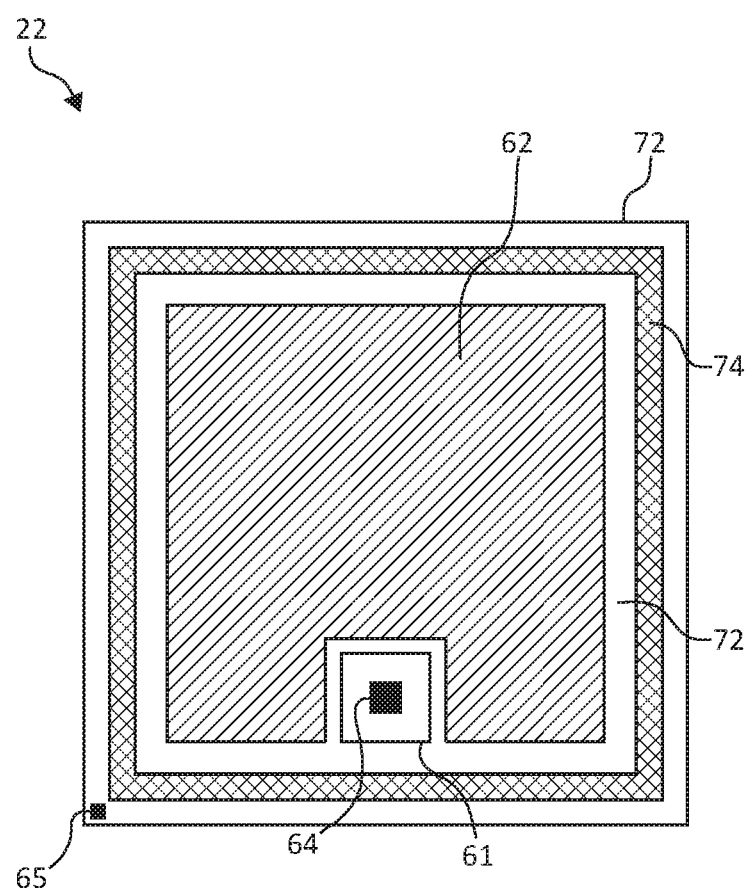
FIG. 13 is a top view of an illustrative imaging pixel with a floating diffusion region shifted towards the periphery of the pixel in accordance with an embodiment of the present invention.

FIG. 13 is a top view of an illustrative imaging pixel. The pixel of FIG. 13 may be similar to the pixel shown in FIGS. 5-7. However, in FIG. 13 the floating diffusion region may be shifted towards the periphery of the pixel. This enables the p-well in the isolation regions (which is grounded by ground contact 65) of the pixel to cover the floating diffusion region. Because the p-well is already grounded, there is no need for the p-stripe that is included in the pixel of FIGS. 5-7. This saves on material and manufacturing costs while producing the pixel.

Figure 14:
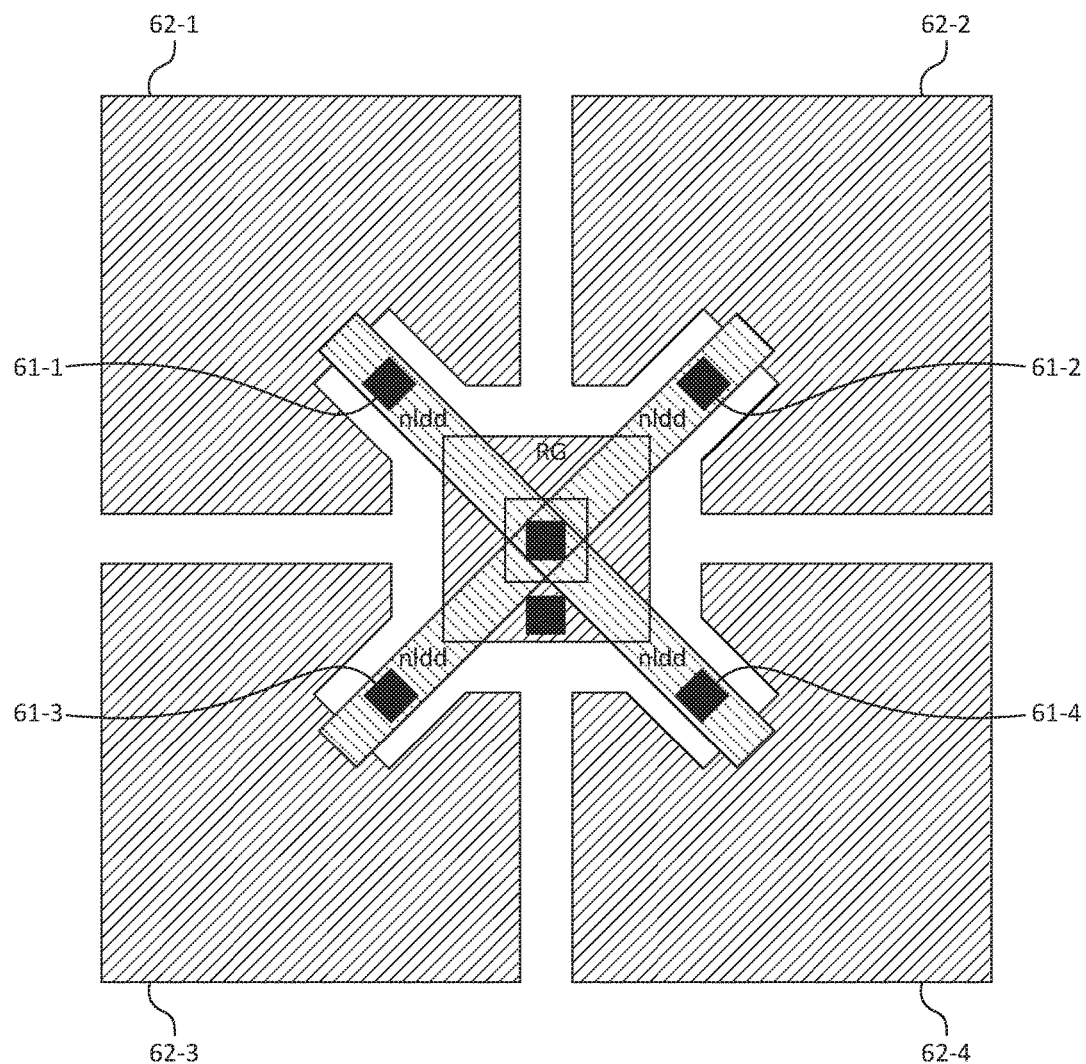
FIG. 14 is a top view of an illustrative group of imaging pixels that share a reset gate in accordance with an embodiment of the present invention.

If desired, neighboring pixels on wafer 42 may share additional components in order to improve certain aspects of pixel performance such as floating diffusion dark current. For example, FIG. 14 is a top view of an illustrative group of imaging pixels that share a reset transistor. Four imaging pixels may each have respective transfer gates (62-1, 62-2, 62-3, and 62-4) that are coupled to respective floating diffusion regions (61-1, 61-2, 61-3, and 61-4). Each floating diffusion region may be coupled to a central reset gate 58 with respective n-type lightly doped drain (nLLD) regions. A drain region may be enclosed by the reset gate 58.

In various embodiments of the invention, an imaging pixel may include a photodiode, isolation regions that at least partially surround the photodiode, a floating diffusion region, a transfer transistor configure to transfer charge from the photodiode to the floating diffusion region, and a p-type doped region between the isolation regions and the floating diffusion region. The transfer transistor may include a transfer gate with an opening, and the floating diffusion region is formed below the opening in the transfer gate.

The imaging pixel may also include a shallow p-well formed around the floating diffusion region. The p-type doped region may include a p-stripe that couples the isolation regions to the shallow p-well formed around the floating diffusion region. The isolation regions may include deep trench isolation. The isolation regions may also include a p-well. The transfer gate may be donut shaped. The photodiode, the isolation regions, the floating diffusion region, and the p-type doped region between the isolation regions and the floating diffusion region may be formed in a first substrate. The imaging pixel may also include an interconnect layer that couples the floating diffusion region in the first substrate to an additional floating diffusion region in a second substrate. The imaging pixel may also include a reset transistor formed in the second substrate that is coupled to the additional floating diffusion region and a source follower transistor formed in the second substrate that is coupled to the additional floating diffusion region. The imaging pixel may also include a contact in the isolation regions that is coupled to ground.

In various embodiments, an imaging sensor may include an array of imaging pixels that are formed in at least first and second substrates. Each imaging pixel of the array of imaging pixels may include a photodiode formed in the first substrate, a floating diffusion region formed in the first substrate, a transfer transistor configured to transfer charge from the photodiode to the floating diffusion region, a shallow p-well that surrounds the floating diffusion region, isolation regions, and a p-stripe that couples the shallow p-well that surrounds the floating diffusion region to the isolation regions. The transfer transistor may include a transfer gate with an opening that overlaps the floating diffusion region.

Each imaging pixel may also include an interconnect layer that couples the first substrate to the second substrate and an additional floating diffusion region formed in the second substrate. The interconnect layer may couple the floating diffusion region in the first substrate to the additional floating diffusion region in the second substrate. Each imaging pixel may also include a reset transistor formed in the second substrate that is coupled to the additional floating diffusion region, and a source follower transistor formed in the second substrate that is coupled to the additional floating diffusion region. The isolation regions of each imaging pixel may include deep trench isolation and/or a p-well. The p-stripe of each imaging pixel may include a strip of p-type doped silicon that extends across the imaging pixel.

The imaging sensor may also include an additional conductive layer that connects at least first and second floating diffusion regions of respective first and second imaging pixels. The imaging sensor may also include an additional conductive layer that connects at least first, second, third, and fourth floating diffusion regions of respective first second, third, and fourth imaging pixels. The first, second, third, and fourth imaging pixels may be arranged in a 2×2 grid.

In various embodiments, a method of forming an imaging pixel with a width may include forming a p-type epitaxial silicon layer on a substrate, implanting n-type dopants into the p-type epitaxial silicon layer to form a photodiode, forming deep trench isolation to surround the photodiode, implanting a p-stripe that runs across the width of the imaging pixel, forming a transfer gate polysilicon layer over the photodiode, and implanting additional n-type dopants to form a floating diffusion region. The imaging pixel may have first and second opposing sides, the deep trench isolation may be formed on the first and second opposing sides of the imaging pixel, and implanting the p-stripe that runs across the width of the imaging pixel may include implanting the p-stripe such that the p-stripe couples the deep trench isolation on the first side of the imaging pixel to the deep trench isolation on the second side of the imaging pixel.

The foregoing is merely illustrative of the principles of this invention and various modifications can be made by those skilled in the art without departing from the scope and spirit of the invention.

What is claimed is:

1. An imaging pixel comprising:
   a photodiode with a center;
   isolation regions that at least partially surround the photodiode;
   a floating diffusion region formed over the center of the photodiode;
   a transfer transistor configured to transfer charge from the photodiode to the floating diffusion region, wherein the transfer transistor comprises a transfer gate with an opening, and wherein the floating diffusion region is formed below the opening in the transfer gate; and
   a p-type doped region between the isolation regions and the floating diffusion region, wherein the p-type doped region comprises a p-type doped strip that extends over the photodiode and divides the photodiode into first and second symmetric halves.

2. The imaging pixel defined in claim 1, further comprising a shallow p-well formed around the floating diffusion region, wherein the p-type doped strip couples the isolation regions to the shallow p-well formed around the floating diffusion region.

3. The imaging pixel defined in claim 2, wherein the isolation regions comprise deep trench isolation.

4. The imaging pixel defined in claim 3, wherein the isolation regions further comprise a p-well.

5. The imaging pixel defined in claim 1, wherein the transfer gate is donut shaped.

6. The imaging pixel defined in claim 1, wherein the photodiode, the isolation regions, the floating diffusion region, and the p-type doped region between the isolation regions and the floating diffusion region are formed in a first substrate, the imaging pixel further comprising an interconnect layer that couples the floating diffusion region in the first substrate to a node in a second substrate.

7. The imaging pixel defined in claim 6, further comprising:
 a reset transistor formed in the second substrate that is coupled to the node; and
 a source follower transistor formed in the second substrate that is coupled to the node.

8. The imaging pixel defined in claim 1, further comprising a contact in the isolation regions that is coupled to ground.

9. The imaging pixel defined in claim 1, further comprising:
 a gate oxide formed underneath the transfer gate; and
 an additional p-type doped region, wherein the gate oxide is interposed between the transfer gate and the additional p-type doped region.

10. An imaging sensor comprising an array of imaging pixels that are formed in at least first and second substrates, each imaging pixel of the array of imaging pixels comprising:
 a photodiode formed in the first substrate;
 a floating diffusion region formed in the first substrate;
 a transfer transistor configured to transfer charge from the photodiode to the floating diffusion region, wherein the transfer transistor comprises a transfer gate with an opening that overlaps the floating diffusion region;
 a shallow p-well that surrounds the floating diffusion region;
 isolation regions; and
 a p-stripe that couples the shallow p-well that surrounds the floating diffusion region to the isolation regions, wherein the p-stripe of each imaging pixel extendalong a longitudinal axis that defines an axis of symmetry for that imaging pixel.

11. The imaging sensor defined in claim 10, wherein each imaging pixel further comprises:
 an interconnect layer that couples the first substrate to the second substrate.

12. The imaging sensor defined in claim 11, wherein each imaging pixel further comprises:
 a node formed in the second substrate, wherein the interconnect layer couples the floating diffusion region in the first substrate to the node in the second substrate.

13. The imaging sensor defined in claim 12, wherein each imaging pixel further comprises:
 a reset transistor formed in the second substrate that is coupled to the node; and
 a source follower transistor formed in the second substrate that is coupled to the node.

14. The imaging sensor defined in claim 10, wherein the isolation regions of each imaging pixel comprise deep trench isolation.

15. The imaging sensor defined in claim 14, wherein the isolation regions of each imaging pixel further comprise a p-well.

16. The imaging sensor defined in claim 15, wherein the p-stripe of each imaging pixel comprises a strip of p-type doped silicon that extends along the longitudinal axis.

17. The imaging sensor defined in claim 10, further comprising:
 an additional conductive layer that connects at least first and second floating diffusion regions of respective first and second imaging pixels.

18. The imaging sensor defined in claim 10, further comprising:
 an additional conductive layer that connects at least first, second, third, and fourth floating diffusion regions of respective first second, third, and fourth imaging pixels.

19. The imaging sensor defined in claim 18, wherein the first, second, third, and fourth imaging pixels are arranged in a 2×2 grid.

* * * * *